United States Patent [19]
Drako et al.

[11] Patent Number: 5,225,723
[45] Date of Patent: Jul. 6, 1993

[54] CIRCUITRY FOR THE TIMING DATA OUTPUT ENABLE PULSES

[75] Inventors: Dean M. Drako; Steven Roskowski, both of Capertino, Calif.

[73] Assignee: Apple Computer, Inc., Cupertino, Calif.

[21] Appl. No.: 851,268

[22] Filed: Mar. 13, 1992

Related U.S. Application Data

[63] Continuation of Ser. No. 528,223, May 24, 1990, abandoned.

[51] Int. Cl.⁵ .................. H03K 19/00; H03K 19/02
[52] U.S. Cl. .................. 307/480; 307/269; 328/63; 328/72; 328/55
[58] Field of Search .................. 307/269, 480, 272.1, 307/268; 328/63, 72, 55

[56] References Cited

U.S. PATENT DOCUMENTS

| | | | |
|---|---|---|---|
| 4,408,333 | 12/1983 | Fujii | 328/63 |
| 4,627,085 | 12/1986 | Yuen | 307/480 |
| 4,943,744 | 7/1990 | Bettramini | 307/480 |
| 4,975,593 | 12/1990 | Kurakaza et al. | 307/269 |
| 5,012,127 | 4/1991 | Gates et al. | 328/63 |

FOREIGN PATENT DOCUMENTS 0266919 11/1988 Japan .................. 307/268

*Primary Examiner*—Timothy P. Callahan
*Attorney, Agent, or Firm*—Blakely, Sokoloff, Taylor & Zafman

[57] ABSTRACT

A circuit for providing data output enable signals to a device comprising apparatus for generating an output enable signal in response to the simultaneous application of a clock signal and a second signal, and apparatus for terminating the output enable signal in response to the termination of the second signal alone.

13 Claims, 4 Drawing Sheets

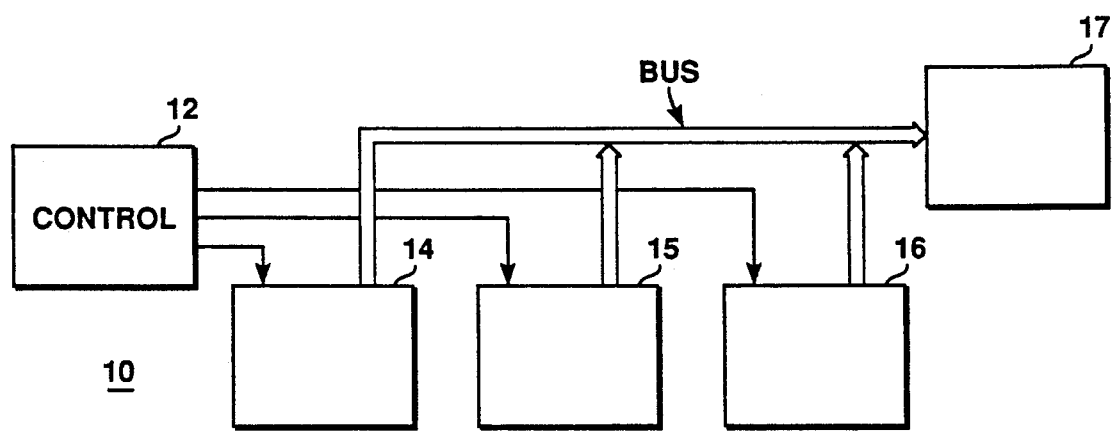
FIGURE 1
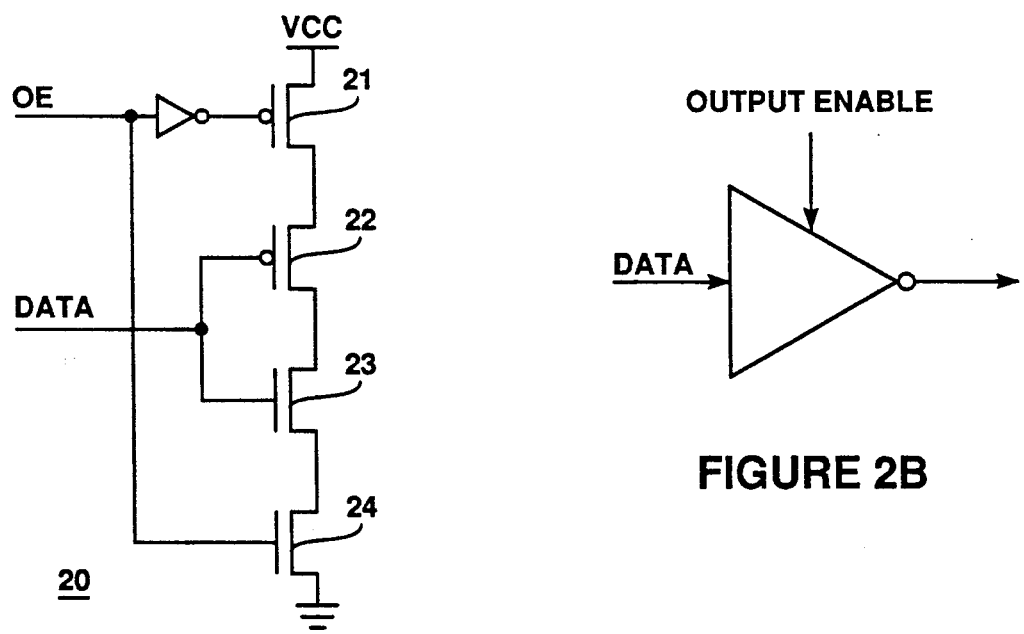
FIGURE 2A
FIGURE 2B

CIRCUITRY FOR THE TIMING DATA OUTPUT ENABLE PULSES

This is a continuation of application Ser. No. 07/528,223, filed May 24, 1990, now abandoned.

BACKGROUND OF THE INVENTION

1. Field of the Invention

This invention relates to timing circuitry and, more particularly, to methods and apparatus for controlling the timing of data output enable signals.

2. History of the Prior Art

A large percentage of the data processing chips which are sold commercially today utilize an enable signal to drive data to the output terminals. The output enable signals are utilized in order to precisely determine the time at which any particular chip provides output signals so that, for example, a plurality of chips will not be providing signals to the same destination at the same time. In all known prior art arrangements, the output enable signal is an asynchronous input signal, a signal which is not sampled by the system clock. The result is that the output is turned on as soon as possible after the enable signal is received and is turned off as soon as possible after the enable signal is removed.

The actual time at which a chip turns on and off in response to the application and removal of the output enable signal depends upon the propagation time within the particular chip. In general, the time may vary by a very large amount for any particular chip. Consequently, it is necessary in most prior art circuits operating at high clock frequencies to provide a significant amount of clock time between enable signals so that two individual sources of data will not both be driving data onto a data bus simultaneously. This provision of time between the end of one enable signal and the beginning of the next (so called dead cycles) to assure that there is no conflict between output enable signals slows the computer system significantly. Moreover, the synchronization of the different output enable signals to assure an appropriate interval for the dead cycle so that the enable signals occur at the correct time is quite difficult.

SUMMARY OF THE INVENTION

It is, therefore, an object of the present invention to improve the apparatus for timing the generation of output enable signals.

It is another object of the present invention to provide apparatus for allowing a single output enable signal to control the operation of a plurality of computer chips.

It is yet another object of the present invention to provide circuitry which precisely determines the length of a dead cycle between output enable signals.

These and other objects of the present invention are realized in a circuit for providing data output enable signals to a device comprising means for generating an output enable signal in response to the simultaneous application of a clock signal and a second signal, and means for terminating the output enable signal in response to the termination of the second signal alone.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a block diagram of a typical digital circuit of the prior art in which output enable signals are utilized.

FIG. 2(a) and (b) illustrates a particular off-chip driver utilizing a output enable signal.

NOTATION AND NOMENCLATURE

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus and to method steps for operating a computer in processing electrical or other (e.g. mechanical, chemical) physical signals to generate other desired physical signals.

DETAILED DESCRIPTION OF THE INVENTION

As pointed out above, a large percentage of the data processing chips which are sold commercially utilize an output enable signal to drive data to the output terminals. The output enable signals are utilized in order to precisely determine the time at which any particular chip provides output signals so that, for example, a plurality of chips will not be providing signals to the same destination at the same time. FIG. 1 illustrates an arrangement 10 in which a control circuit 12 provides output enable signals to precisely control the time at which circuits 14, 15, and 16 furnish data to a destination circuit 17. Without such output enable signals, circuits 14 and 15 might both attempt to furnish data simultaneously to the circuit 17.

Figure 3A:
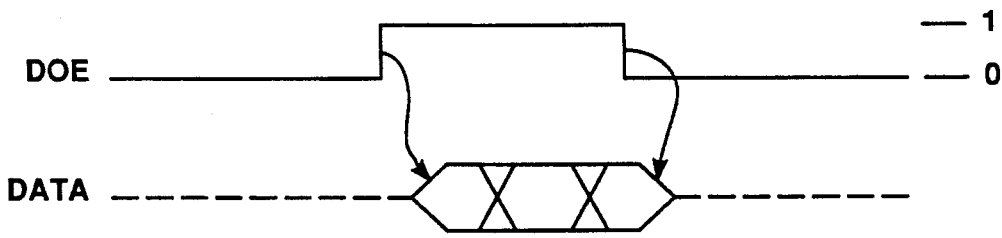
FIGS. 3a, 3b and 3c are timing diagrams illustrating a conflict which may occur in operating a number of chips on a bus and a typical resolution of the conflict.

In all known prior art arrangements, the output enable signal is an asynchronous input signal, a signal which is not sampled by the system clock. The result is that any chip responding to an output enable signal is turned on as soon as possible when the enable signal is received and is turned off as soon as possible when the output enable signal is removed. The upper two signals referred to as DOE and Data in FIG. 3a illustrates this. When the DOE (data output enable) signal goes positive (a one condition), data is allowed to flow at the output terminal of the particular chip. When the DOE signal goes negative (is removed), the data flow at the output terminal is terminated.

An off chip driver circuit 20 for accomplishing the output enable function is illustrated in FIG. 2(a). The CMOS circuit 20 includes a pair of P devices 21 and 22 and a pair of N devices 23 and 24 connected between a voltage Vcc (one) and ground (zero). A one at the data input terminal is inverted and transmitted by the device 23 in the presence of an output enable signal at the output enable terminal which turns on the device 24. A zero at the data input terminal is inverted and transmitted by the device 22 in the presence of an output enable signal at the output enable terminal which turns on the device 21. The absence of the output enable signal disables both of the devices 22 and 23 and no output appears at the output terminal of the circuit 20. FIG. 2(b) illustrates a typical symbol for an off chip driver circuit such as that illustrated in detail in FIG. 2(a).

The actual time at which a chip turns on and off in response to the application and removal of an output enable signal depends upon the propagation time of the signal within the particular chip. In general, the time may vary by a very large amount for any particular chip. It is not atypical for different examples of supposedly identical circuits to have propagation times which vary by two to one. The effect of this is that it is necessary in most prior art circuits operating at high clock frequencies to provide a significant amount of clock time between enable signals. This is necessary so that two individual sources of data will not both be driving data onto a bus simultaneously.

Figure 3B:
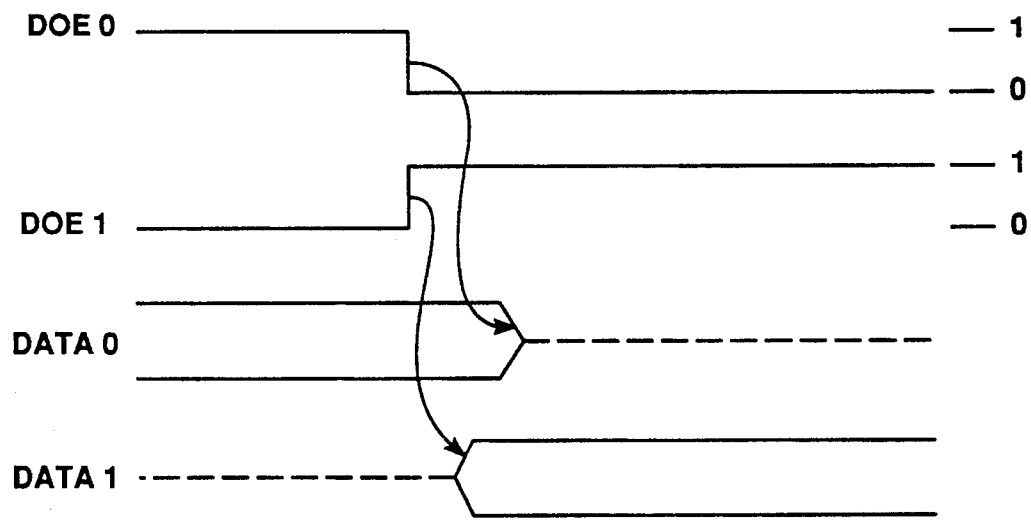

FIG. 3b shows four signals DOE0, DOE1, Data0, and Data1 which illustrate this problem. DOE0 controls the transmission of Data0 while DOE1 controls the transmission of Data1. While DOE0 is high, Data0 is being transmitted. When DOE0 goes low, Data0 cuts off after some propagation delay. It is desired to transmit Data1 as soon as possible after Data0 terminates so DOE1 is driven high at the same instant that DOE0 terminates. However, it will be seen that it is possible if the propagation time of the second circuit is shorter than that of the first circuit that the Data1 signal will appear at the output before Data0 terminates. This will cause a driver conflict. For example, in the circuit 10 of FIG. 1, two source circuits will be attempting to drive data to the same destination 17 at the same time.

Figure 3C:
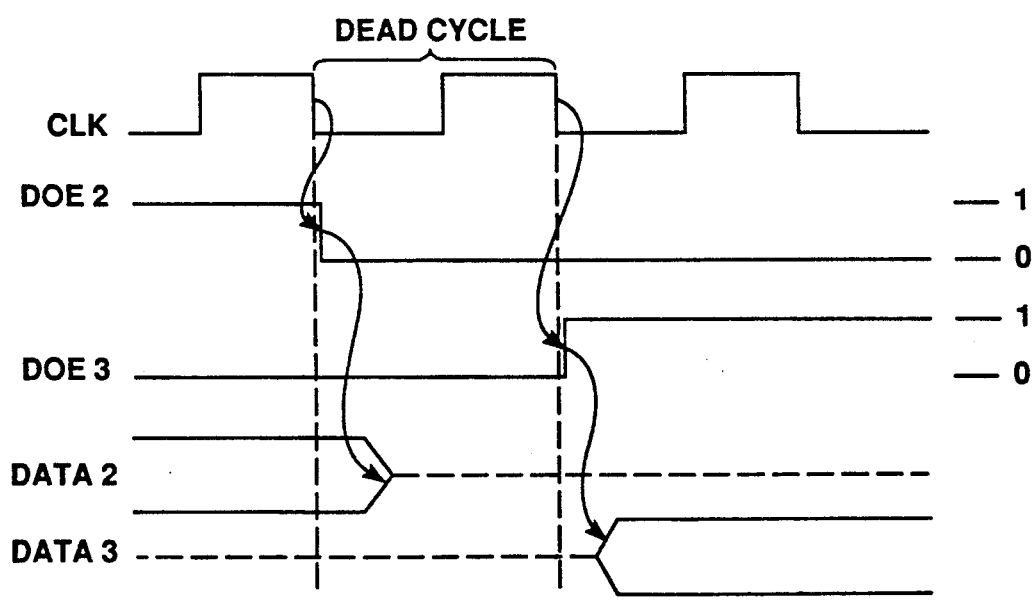

As was mentioned above, the typical method for resolving this problem is to provide dead time between the termination of one output enable signal and the turn on of the next output enable signal. FIG. 3c illustrates the usual solution. A first output enable signal DOE2 is driven off the clock signal CLK and is brought low to terminate the data signal Data2 from the first chip. After some period of time less than one clock cycle controlled by the signal propagation time, the data signal Data2 terminates. A second output enable signal DOE3 is initiated one clock cycle later by the falling edge of the clock signal CLK. The output enable signal DOE3 initiates the data output signal Data3 from a second chip. In this manner the two enable signals are separated by a dead cycle, and no driver conflict arises. However, in both the initiation and the termination of the data signals, a delay which is the sum of the delay to initiate the output/enable signal and the data signal is incurred.

Thus, the provision of time between the end of one enable signal and the beginning of the next to assure that there is no conflict between output enable signals slows the computer system significantly. Moreover, the synchronization of the different output enable signals to assure an appropriate interval for the dead cycle so that the enable signals occur at the correct time is difficult because of the differing propagation times encountered.

Figure 4A:
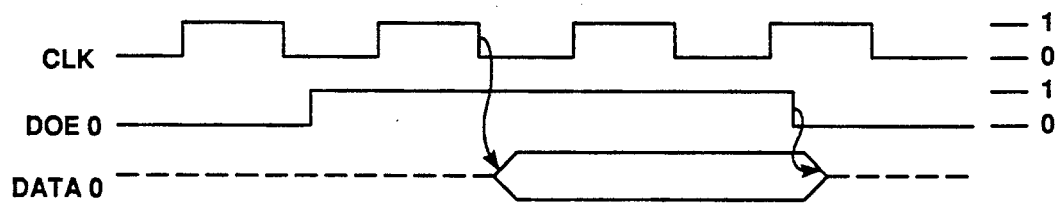
FIGS. 4a, 4b and 4c are timing diagrams illustrating a resolution of a conflict in accordance with the invention and possible utilizations of the arrangement.

FIG. 4a is a timing diagram illustrating a resolution of driver conflict in accordance with the invention. The output enable DOE0 can occur any time between the falling edges of a clock signal CLK although the output enable signal DOE0 is typically initiated by the falling edge of the clock signal CLK. A data output signal Data0 is then initiated by both the output enable signal DOE0 going high and the next falling edge of the clock signal CLK. This assures that the data signal Data0 follows the initiation of the output enable signal by a predetermined dead cycle. The data signal Data0 is then terminated by the termination of the one condition of the output enable signal DOE0. Thus, the data output may be considered to be synchronized to the clock at initiation but asynchronous at termination so that only one delay is incurred at initiation of the data signal.

Figure 4B:
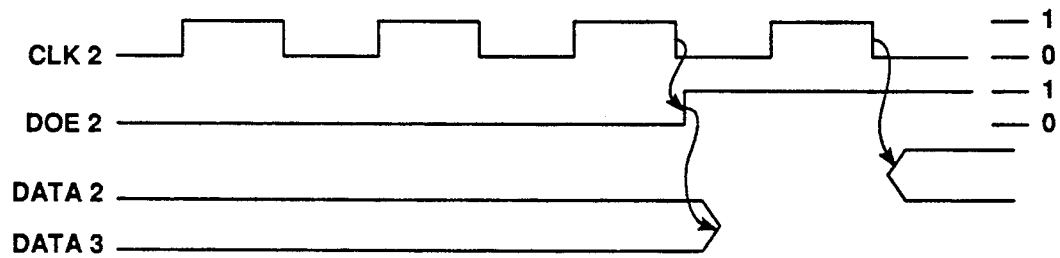
Figure 4C:
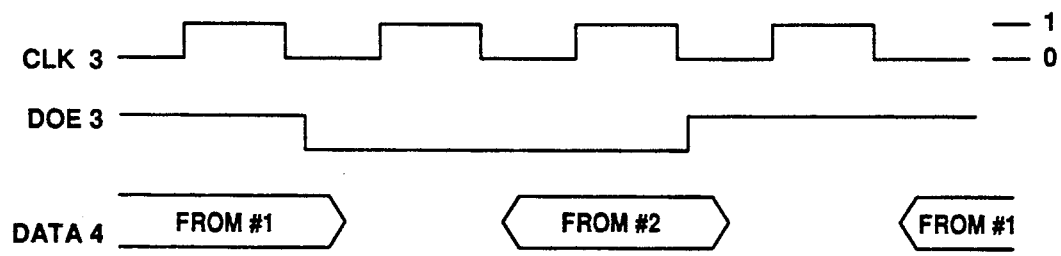

The second set of signals in the timing diagram of FIG. 4b illustrates one particular use for the invention. In this case a single output enable signal DOE2 is utilized to enable and disable distinct chips having data output signals Data2 and Data3. The output enable signal DOE2 is used in its inverted state to initiate the data output signal Data3 at a point prior to the beginning of the diagram. When the output enable signal DOE2 goes positive, the data output signal Data3 is terminated. At the falling edge of the next clock signal CLK, the one condition of the output enable signal DOE2 initiates the data output signal Data2. Thus, a single enable signal may be used to control the initiation and termination of two separate data signals and to provide a guaranteed dead cycle on the system bus. Such an arrangement is especially desirable is an arrangement in which it is desired to produce output signals on a data path from a first circuit directed to a second circuit and immediate respond to those output signals by producing output signals from the second circuit to the first circuit on the same data path. The features of such an operation are clearly illustrated by the three signals CLK3, DOE4, and Data4 illustrated in FIG. 4c.

Figure 5:
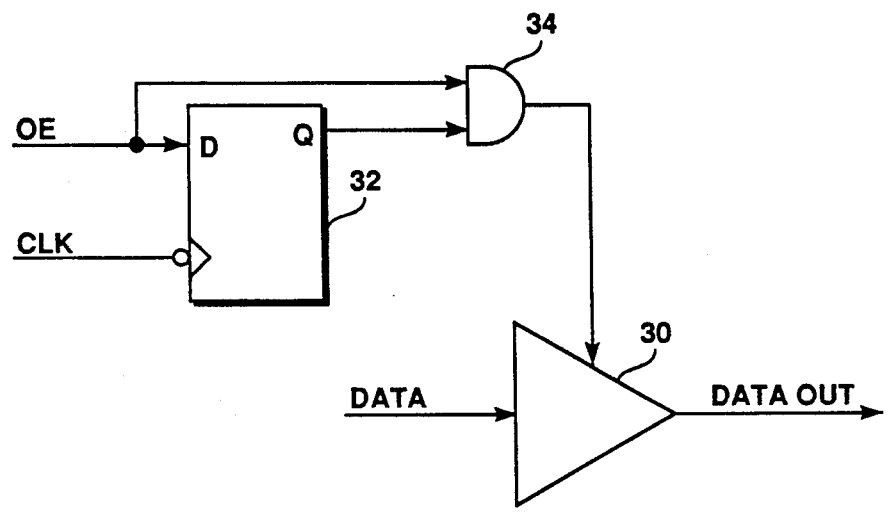
FIG. 5 is a block diagram of a circuit in accordance with the invention for precisely controlling output enable signals.
Figure 6:
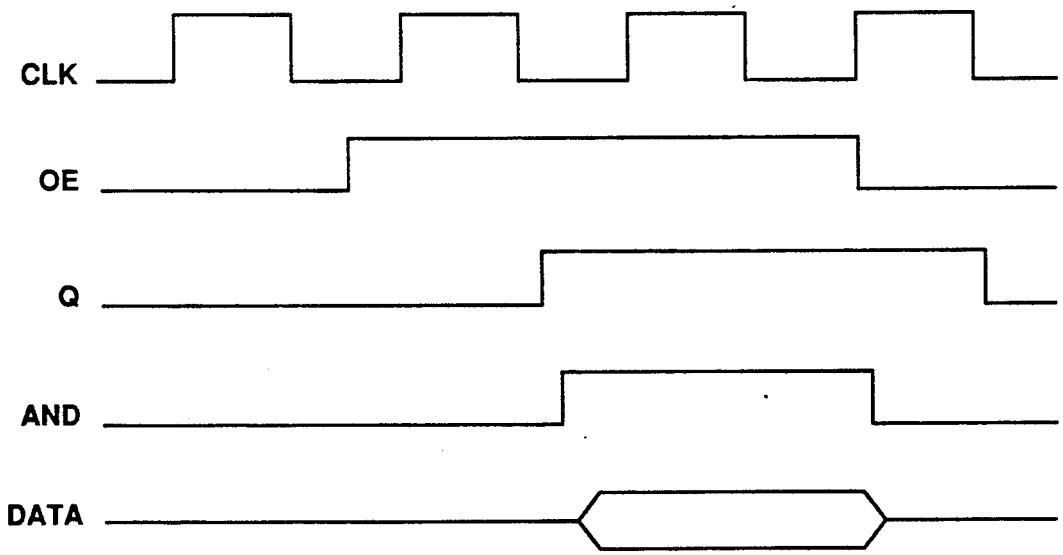
FIG. 6 is another timing diagram illustrating the operation of the invention.

FIG. 5 is a block diagram of a circuit 30 in accordance with the invention for precisely controlling output enable signals in the manner described above; FIG. 6 is a timing diagram of the signals processed by the circuit 30. In the arrangement of FIG. 5, an off chip driver 30 having a data input terminal and an enable terminal is shown. An output enable signal is furnished as the D input to a D flip-flop 32. A clock pulse (NOT CLK) is furnished to the clock terminal of the D flip-flop 32. Consequently, the Q terminal of the D flip-flop 32 produces an output signal when the output enable signal is high and the falling clock edge appears. This output is furnished to an AND gate 34 where it is ANDed with the output enable signal to produce an output enable signal synchronized to the system clock for enabling the data output of the off chip driver 30. The Q terminal continues to output the enable signal so long as the output enable signal is applied at the D input terminal; but when the output enable signal is removed from the AND gate 34, the enable signal is immediately removed from the driver 30 and its data output is terminated. Consequently, the arrangement produces the desired synchronous turn-on and asynchronous turn-off of the driver 30.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for generating timed output enable signals to device to enable the output of data comprising:
   a D flip-flop having an input terminal for receiving a first output enable signal, an enable terminal for receiving clock pulses, and an output terminal for generating output signals according to said clock pulses;
   an AND gate connected to receive said first output enable signals and output signals at the output terminal of the D flip-flop, wherein said AND gate comprises an output providing said timed output enable signals such that said timed output enable signals begin synchronously with said clock pulses and end asynchronously with said clock pulses; and
   driver means for receiving said data and being responsive to said timed output enable signals, such that said driver means outputs said data upon receiving said timed output enable signal.

2. A circuit for providing data output enable signals to a device to enable the transfer of data, said circuit comprising:
   a means for receiving a clock signal;
   a means for receiving a first output enable signal;
   a means for generating a second output enable signal, said means for generating being coupled to said means for receiving said clock signal and being coupled to said means for receiving said first output enable signal;
   a means for terminating said second output enable signal, said means for terminating being coupled to said means for generating, said means for terminating said second output enable signal being responsive to the termination of said first output enable signal and terminating said second output enable signal asynchronously in response to said termination of the first enable signal; and
   a means for receiving and driving said data and being coupled to said second output enable signal, that said means for receiving enables said data to said device in response to said second output enable signal.

3. A circuit as in claim 2 wherein said means for generating comprises a flip-flop.

4. A circuit as in claim 3 wherein said means for generating further comprises an AND gate and said flip-flop is a D-type flip-flop having a clock input and a D input and further wherein said means for receiving a clock signal is said clock input of said flip-flop and said means for receiving said first output enable signal is said D input to said flip-flop.

5. A circuit as in claim 4 wherein said means for terminating comprises and electrical connection which couples said first output enable signal to said AND gate, wherein said first output enable signal is an input to said AND gate.

6. A circuit as in claim 4 wherein said means for receiving and driving said data comprises a data driver having a data input terminal, a data output terminal and an enable terminal, said enable terminal being coupled to receive said second output enable signal.

7. A circuit for enabling the output of data to a device comprising:
   a) means for generating a first output signal, said means for generating including a first input terminal, a second input terminal, and a first output terminal;
   b) a first input signal coupled to said first input terminal;
   c) a second input signal coupled to said second input terminal, such that said first output signal is generated when said second input signal is asserted if said first input signal is asserted;
   d) means for generating an output enable signal including a third input terminal coupled to receive said first input signal, a fourth input terminal coupled to said first output terminal, and a second output terminal carrying said output enable signal said means for generating terminating said output enable signal asynchronously in response to a termination of the first input signal;
   e) means for driving said data and being coupled to said means for generating, such that said means for driving enables said data to said device in response to said output enable signal from said means for generating.

8. A circuit as in claim 7 wherein said means for generating said first output signal comprises a negative edge trigger flip flop.

9. A circuit as in claim 8 wherein said first signal comprises a first output enable signal.

10. A circuit as in claim 7 wherein said second signal comprises a system clock signal such that said first output signal is generated according to said clock system clock signal if said first input signal is asserted.

11. A circuit as in claim 10 wherein said means for generating said output enable signal further comprises an AND gate.

12. A method for enabling an output of data comprising:
   a) providing a first input signal to a flip flop, said first input signal having a first and a second state;
   b) providing a second input signal to said flip flop;
   c) generating a first output signal from said flip flop when said first signal is in said first state and said second signal triggers said flip flop;
   d) generating a second output signal in response to said first state of said first input signal and said first output signal, said second output signal being an output enable signal, wherein if said first state of said first signal is terminated, said method includes the step of asynchronously terminating said output enable signal; and
   e) enabling the output of said data in response to said output enable signal.

13. The method of claim 12 wherein said second input signal comprises a system clock signal.

* * * * *